(12) United States Patent
Chen

(10) Patent No.: US 10,123,139 B2
(45) Date of Patent: Nov. 6, 2018

(54) EQUALIZED HEARING AID SYSTEM

(71) Applicant: UBDEVICE CORP., Taoyuan (TW)

(72) Inventor: Wei-Chieh Chen, Taoyuan (TW)

(73) Assignee: UBDEVICE CORP., Taoyuan (TW)

( * ) Notice: Subject to any disclaimer, the term of this patent is extended or adjusted under 35 U.S.C. 154(b) by 0 days.

(21) Appl. No.: 15/798,372

(22) Filed: Oct. 30, 2017

(65) Prior Publication Data

US 2018/0048972 A1 Feb. 15, 2018

Related U.S. Application Data

(63) Continuation-in-part of application No. 15/081,961, filed on Mar. 28, 2016, now Pat. No. 9,843,874.

(51) Int. Cl.
| | |
|---|---|
| *H04R 25/00* | (2006.01) |
| *H03G 5/16* | (2006.01) |
| *H04W 4/80* | (2018.01) |

(52) U.S. Cl.
CPC .............. *H04R 25/70* (2013.01); *H03G 5/165* (2013.01); *H04R 25/353* (2013.01); *H04R 25/43* (2013.01); *H04R 25/50* (2013.01); *H04R 25/505* (2013.01); *H04R 25/554* (2013.01); *H04W 4/80* (2018.02); *H04R 2225/55* (2013.01)

(58) Field of Classification Search
CPC ....... H04R 25/70; H04R 25/554; H03G 5/165
USPC .................................................. 381/314–318
See application file for complete search history.

(56) References Cited

U.S. PATENT DOCUMENTS

| | | | | |
|---|---|---|---|---|
| 8,891,793 B1 * | 11/2014 | Sacha | ................... | H04R 25/558 |
| | | | | 381/312 |
| 9,843,874 B2 * | 12/2017 | Chen | ..................... | H04R 25/353 |
| 2003/0045283 A1 | 3/2003 | Hagedoorn | | |
| 2003/0138117 A1 * | 7/2003 | Goff | ......................... | H03G 3/32 |
| | | | | 381/103 |
| 2003/0181175 A1 * | 9/2003 | Darabi | ................. | H03G 3/3052 |
| | | | | 455/136 |
| 2004/0196998 A1 | 10/2004 | Noble | | |
| 2008/0039017 A1 * | 2/2008 | Kim | ..................... | H04M 1/6066 |
| | | | | 455/41.2 |
| 2008/0165994 A1 * | 7/2008 | Caren | ................. | H04R 25/554 |
| | | | | 381/312 |
| 2008/0181284 A1 * | 7/2008 | Husted | .................... | H04B 1/30 |
| | | | | 375/130 |

(Continued)

FOREIGN PATENT DOCUMENTS

WO    2015109002 A2    7/2015

*Primary Examiner* — Matthew Eason
*Assistant Examiner* — Julie X Dang
(74) *Attorney, Agent, or Firm* — Winston Hsu

(57) ABSTRACT

An equalized hearing aid system includes a microphone, a first equalizer, a first mixer, and a first speaker coupled in series forming a first signal path with a second mixer coupled to the first equalizer within the first signal path. The microphone, a second equalizer, a third mixer, and a second speaker are coupled in series forming a second signal path with a fourth mixer coupled to the second equalizer within the second signal path. A control interface may be coupled to at least one of the first equalizer and the second equalizer. A Bluetooth module may be coupled to at least one of the first equalizer and the second equalizer. A third equalizer may be coupled to input signal into the first signal path and a fourth equalizer may be coupled to input signal into the second signal path.

11 Claims, 13 Drawing Sheets

(56) References Cited

U.S. PATENT DOCUMENTS

| | | | |
|---|---|---|---|
| 2009/0074206 A1* | 3/2009 | Bradford | H03G 3/32 |
| | | | 381/103 |
| 2009/0147884 A1* | 6/2009 | Sridharan | H03D 7/165 |
| | | | 375/316 |
| 2009/0227288 A1 | 9/2009 | Hawker | |
| 2010/0057471 A1 | 3/2010 | Kong | |
| 2010/0150383 A1* | 6/2010 | Sampat | H04R 1/10 |
| | | | 381/311 |
| 2010/0316027 A1* | 12/2010 | Rick | H04B 1/406 |
| | | | 370/336 |
| 2011/0235833 A1 | 9/2011 | Hensen | |
| 2012/0177224 A1 | 7/2012 | Veneri | |
| 2013/0108078 A1 | 5/2013 | Ma | |

* cited by examiner

EQUALIZED HEARING AID SYSTEM

CROSS REFERENCE TO RELATED APPLICATIONS

This application is a continuation-in-part of U.S. patent application Ser. No. 15/081,961, filed Mar. 28, 2016, and included herein by reference in its entirety.

BACKGROUND OF THE INVENTION

1. Field of the Invention

This application relates to a hearing aid system, and more particularly to a hearing aid system comprising a user configurable equalizer.

2. Description of the Prior Art

A hearing aid is defined and regulated by the U.S. Food and Drug Administration (FDA) and is an electroacoustic device which is designed to amplify sound for the wearer, usually with the aim of making speech more intelligible, and to correct impaired hearing as measured by audiometry.

Most forms of correctable hearing loss exhibit different characteristics according to frequency of the sound. For example, one user may find difficulty in hearing lower frequencies while another user's difficulty may reside in higher frequencies. Many hearing aids address this problem using frequency compression and/or by shifting inputted frequencies to a higher or lower frequency where they may be more audible to the user of the hearing aid without requiring excessive amplification. Unfortunately, shifting of frequencies often results in an unnatural sound quality.

Another difficulty in the use of such hearing aids is that such approaches are frequently fixed at manufacture and are not readily adjustable depending upon local environmental variables or user preferences in different situations.

SUMMARY OF THE INVENTION

An equalized hearing aid system is proposed that gives the user great flexibility to easily control amplitudes of different audio frequency bands whether from a single source or simultaneously from multiple sources, and may include one speaker or a plurality of speakers providing multiple audio channels.

The equalized hearing aid system comprises a microphone, a first variable gain amplifier, a first equalizer, a first mixer, and a first speaker coupled in series forming a first signal path, and a second mixer coupled to the first equalizer within the first signal path. The equalized hearing aid system may further include a Bluetooth module coupled to the first equalizer, and/or a control interface coupled to the first equalizer for controlling the first equalizer. The equalized hearing aid system is configured such that the Bluetooth module may transmit control signals received from another Bluetooth enabled device to the first equalizer for controlling the equalizer, to transmit audio signals received from the microphone to another Bluetooth enabled device, and/or transmit audio signals received from another Bluetooth enabled device to the second mixer.

The equalized hearing aid system may further comprise the microphone, a second variable gain amplifier, a second equalizer, a third mixer, and a second speaker coupled in series forming a second signal path with a fourth mixer coupled to the second equalizer within the second signal path. A third equalizer may be coupled to input signal into the first signal path and a fourth equalizer may be coupled to input signal into the second signal path.

A preferred equalized hearing aid system may comprise a microphone, a first variable gain amplifier, a first equalizer, a first mixer, and a first speaker coupled in series forming a first audio channel with a second mixer coupled to the first equalizer within the first signal path, the microphone, a second equalizer, a third mixer, and a second speaker coupled in series forming a second audio channel with a fourth mixer coupled to the second equalizer within the second audio channel, a control interface coupled to the first equalizer for controlling the first equalizer and to the second equalizer for controlling the second equalizer, and a Bluetooth module coupled to the first and second equalizers, wherein the Bluetooth module is configured to transmit audio signals received from another Bluetooth enabled device to the first and second equalizers and/or control signals received from the Bluetooth enabled device to the first and/or second equalizers for controlling the first and/or second equalizer respectively. An output of the Bluetooth module is preferably coupled to the second mixer and to the fourth mixer. A third equalizer may be coupled to input signal into the first signal path and a fourth equalizer may be coupled to input signal into the second signal path.

An equalized hearing aid system may also comprise a microphone, a first variable gain amplifier, a first equalizer, a first mixer, and a first speaker coupled in series forming a first signal path, a second mixer coupled to the equalizer within the first signal path. The microphone, a second variable gain amplifier, a second equalizer, a third mixer, and a second speaker coupled in series forming a second signal path with a fourth mixer coupled to the second equalizer within the second signal path. A control interface may be coupled to the first equalizer for controlling the first equalizer and to the second equalizer for controlling the second equalizer. A Bluetooth module may be coupled to the first equalizer and to the second equalizer with the Bluetooth module configured to transmit audio signals received from another Bluetooth enabled device to at least one of the first and second signal paths and/or to transmit control signals received from the another Bluetooth enabled device to at least one of the first equalizer for controlling the first equalizer and to the second equalizer for controlling the second equalizer. A third equalizer may be coupled to input signal into the second mixer and a fourth equalizer may be coupled to input signal into the fourth mixer. The Bluetooth module may be further configured to transmit control signals received from another Bluetooth enabled device to at least one of the third equalizer for controlling the third equalizer and to the fourth equalizer for controlling the fourth equalizer.

These and other objectives of the present invention will no doubt become obvious to those of ordinary skill in the art after reading the following detailed description of the preferred embodiment that is illustrated in the various figures and drawings.

DETAILED DESCRIPTION

An equalizer as used herein is a circuit or equipment used to strengthen or weaken the energy of specific frequency bands by adjusting amplitude of audio signals at particular frequencies. Equalization may be used to eliminate unwanted sounds, make certain sounds more prominent, enhance particular aspects of a tone, combat feedback, adjust the timbre of individual sounds, and to fit individual sounds within or remove individual sounds from the overall frequency spectrum of the mix.

Bluetooth as used herein is a wireless technology standard for exchanging data over short distances using short-wavelength UHF radio waves in the industrial, scientific and medical (ISM) band from 2.4 to 2.485 GHz. Bluetooth is managed by the Bluetooth Special Interest Group (SIG), which oversees development of the specification. Herein, the term Bluetooth refers to wireless technology consistent with the Bluetooth specification. Bluetooth® Core Specification 4.2 is included herein by reference.

Throughout this application, the term "preferably" means desired but is optional and not required according to design considerations. The term "coupled" means having a direct or an indirect electrical path, again, according to design considerations. Although even a wire inherently changes a signal within it, a direct electrical path between components A and B is intended to mean that no additional component is in the electrical path between components A and B that is used to intentionally delay, store, and/or alter the signal between components A and B.

Figure 1:
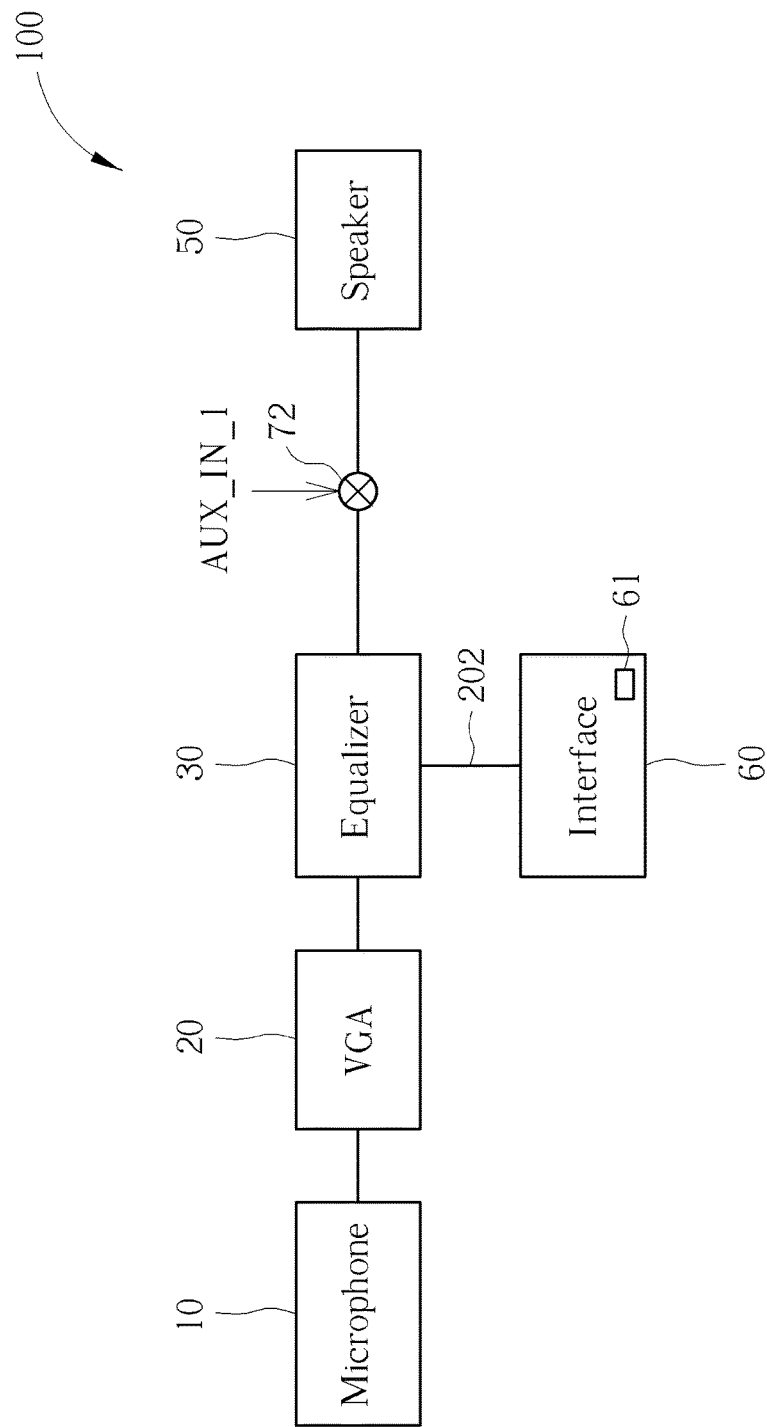
FIG. 1 is a functional block diagram of an equalized hearing aid.

FIG. 1 is a functional block diagram of an equalized hearing aid 100, i.e., a hearing aid that comprises an equalizer. Equalized hearing aid 100 comprises a microphone 10, a first variable gain amplifier (VGA) 20, a first equalizer 30, a first mixer 72 optionally connected to a first auxiliary input AUX_IN_1, and a first speaker 50 coupled in series to form a signal path. The first mixer 72 is configured to optionally receive Bluetooth signal and/or signal from the first auxiliary input AUX_IN_1 for output to the first speaker 50 and/or combine the received signal with signal received from the first equalizer 30 to output the combined signal to the first speaker 50. The first mixer 72 is also configured to optionally bypass any received Bluetooth signal and/or signal from the first auxiliary input AUX_IN_1 and output signal received from the first equalizer 30 to the first speaker 50 according to user preference. The first equalizer 30 preferably includes a driver module for driving electrically coupled speakers, however the driver module may be located in the first mixer 72, in the first speaker 50, or another suitable location according to design considerations.

To offer a means of control of the first equalizer 30, equalized hearing aid 100 also preferably includes a control interface 60 coupled or detachably coupled to the first equalizer 30. The control interface 60 preferably can control the first equalizer 30 parameters and sound volume through the first equalizer 30. The control interface 60 may include knobs, dials, buttons, or other control hardware and/or software to control the first equalizer 30 to adjust amplitude of the audio signals at particular frequencies via the first equalizer 30. The control interface 60 preferably can be any user-defined interface, such as an Inter-Integrated Circuit ($I^2C$) interface, a Universal Asynchronous Receiver/Transmitter (UART) interface, a Serial Peripheral Interface (SPI), or any other suitable interface. The control interface 60 preferably further includes a connector 61, such as an audio jack or a Universal Serial Device (USB) port, so that at least a portion of the control interface 60 may be decoupled from the first equalizer when not needed. When the connector 61 is present and the user desires to adjust the equalization levels, at least a portion of the control interface 60 can be coupled to the first equalizer 30 via the connector 61 so that the appropriate command signals may be sent from the at least a portion of the control interface 60 to the first equalizer 30.

In FIG. 1, sound is received by the microphone 10, generating audio signals that may be amplified by the first VGA 20, then sent to the first equalizer 30 for adjustment of amplitude of the audio signals at particular frequencies according to settings selected by the user via the control interface 60. After equalization, the audio signals may be transmitted to the first speaker 50 via the first mixer 72.

Figure 2:
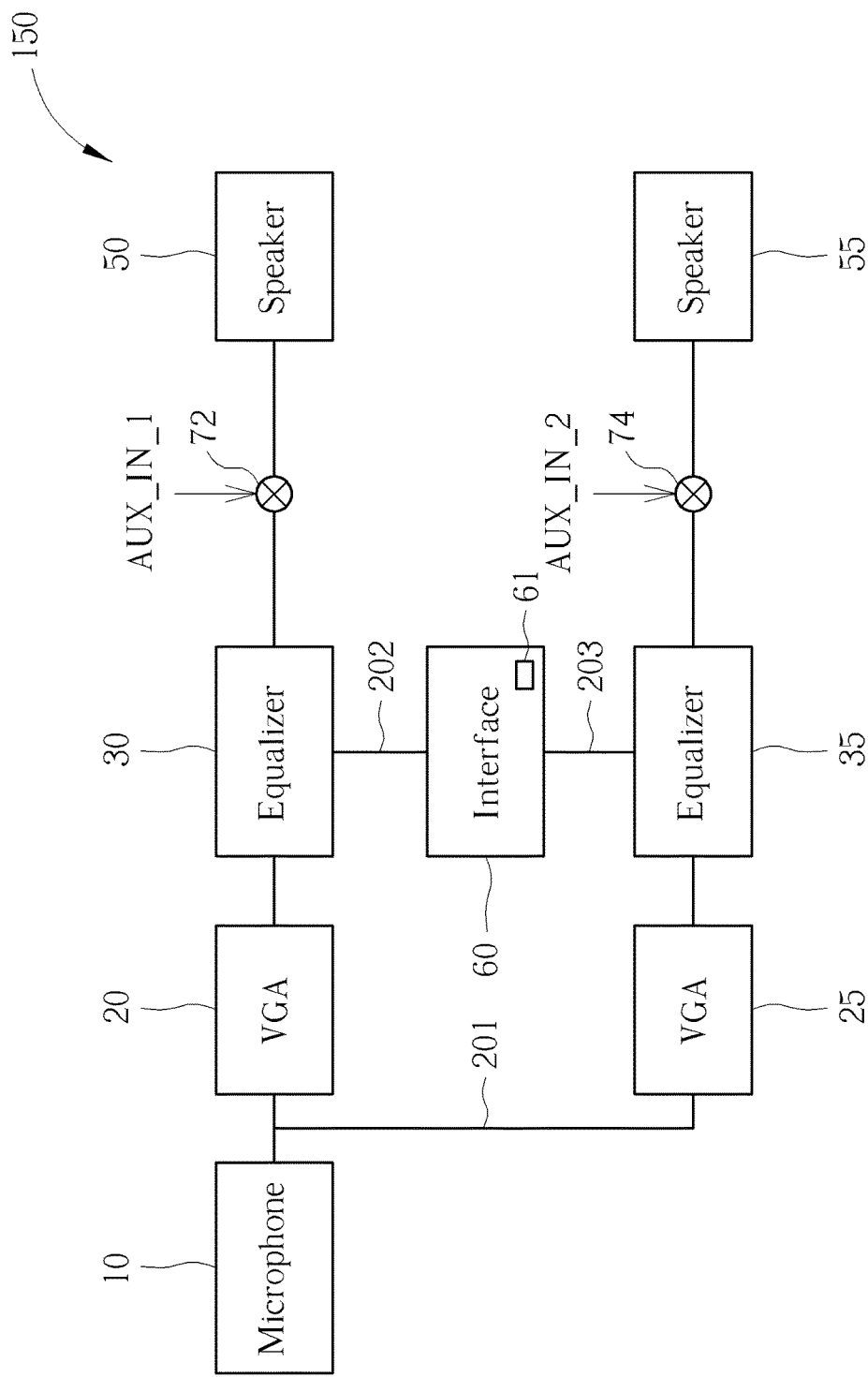
FIG. 2 is a functional block diagram of an equalized hearing aid having preferred enhancements to the equalized hearing aid of FIG. 1.

FIG. 2 is a functional block diagram of an equalized hearing aid 150 having preferred enhancements to the equalized hearing aid 100 of FIG. 1. In FIG. 2, as in all figures, components having similar functionality share the same identification label number.

The equalized hearing aid 150 may include the microphone 10, the first variable gain amplifier 20, the first equalizer 30, the first mixer 72, and the first speaker 50 coupled in series to form the first signal path, and the interface 60 of FIG. 1. In addition to what is shown in FIG. 1, the equalized hearing aid 150 also preferably includes the microphone 10, a second variable gain amplifier 25, a second equalizer 35, a second mixer 74 configured to receive input from a second auxiliary input AUX_IN_2, and a second speaker 55 coupled in series to form a second signal path. The second equalizer 35 is also coupled to the interface 60.

In FIG. 2, preferably, the second VGA 25 is functionally similar to the VGA 20, the second equalizer 35 is functionally similar to the first equalizer 30, and the second mixer 74 is functionally similar to the first mixer 72. The two speakers 50, 55 preferably respectively correspond to a left and a right audio channel. The left and right audio channels may carry a same audio signal or different audio signals according to design or user preferences. The interface 60 is also preferably configured to allow independent control of the parameters for the two equalizers 30, 35 and independent control of respective audio volumes of the two speakers 50, 55.

Figure 3:
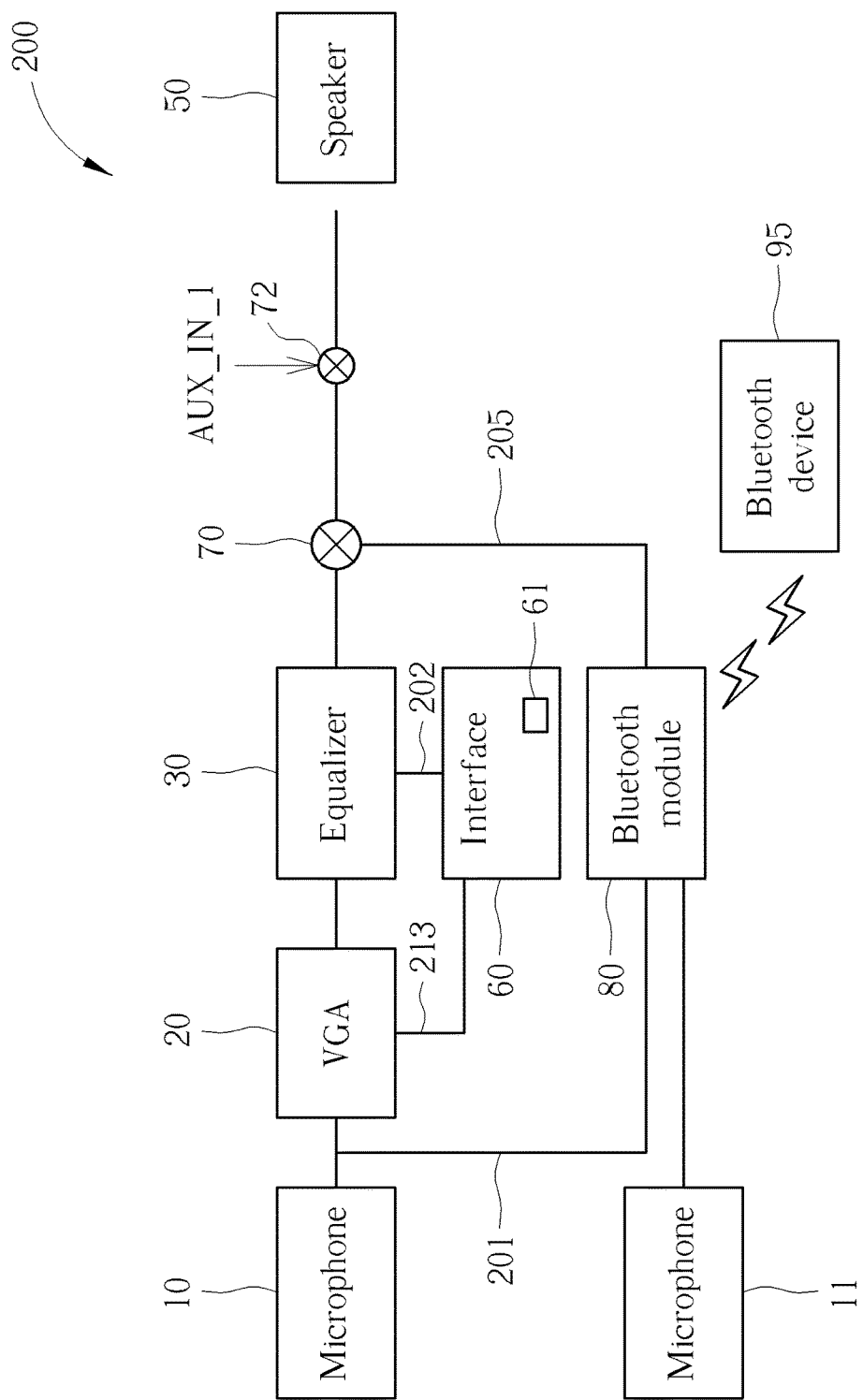
FIG. 3 is a functional block diagram of an equalized hearing aid having preferred enhancements to the equalized hearing aid of FIG. 1.

FIG. 3 is a functional block diagram of an equalized hearing aid 200 having preferred enhancements to the equalized hearing aid 100 of FIG. 1.

The equalized hearing aid 200 may include the microphone 10, the first variable gain amplifier 20, the first equalizer 30, the first mixer 72, and the first speaker 50 coupled in series. The equalized hearing aid 200 also preferably comprises the control interface 60 and also preferably includes the Bluetooth module 80 coupled to the first equalizer and is configured to transmit control signals received from another Bluetooth enabled device 95 to the first equalizer 30 for controlling the first equalizer 30.

The Bluetooth module 80 may be further coupled to a second mixer 70 via connection line 205. The second mixer 70 is preferably coupled within the first signal path in series between the equalizer 30 and the first mixer 72 and mixes audio signals received by the Bluetooth module 80 with audio signals exiting the first equalizer 30. Thus, when the Bluetooth module 80 is paired with a suitable Bluetooth enabled device 95, for example a smartphone, a computer, or tablet, audio signals transmitted by the Bluetooth enabled device 95 are received by the Bluetooth module 80, transmitted from the Bluetooth module 80 to the second mixer 70. According to user preference, the audio signals from the Bluetooth module 80 and received by the second mixer 70 may be combined by the second mixer 70 with equalized audio signals originating at the microphone 10 to produce a combined audio signal transmitted to the first mixer 72. The second mixer 70 may be optionally configured by a user to ignore audio signals audio signals from the Bluetooth module 80 and transmit equalized audio signals originating at the microphone 10 to the first mixer 72 or alternatively configured by a user to ignore equalized audio signals originating at the microphone 10 and transmit the audio signals from the Bluetooth module 80 to the first mixer 72.

The first mixer 72 is also configured to optionally bypass any received Bluetooth signal and/or signal from the first auxiliary input AUX_IN_1 and output signal received from the first equalizer 30 to the first speaker 50 according to user preference or to optionally bypass signal received from the first equalizer 30 and output any received Bluetooth signal and/or signal from the first auxiliary input AUX_IN_1 to the first speaker 50. The equalized hearing aid 200 preferably also includes a connection line 201 between the microphone 10 and the Bluetooth module 80 so that audio signals received by the microphone 10 may be transmitted from the Bluetooth module 80 to the Bluetooth enabled device 95 when desired.

It is again noted that the first mixer 72 is configured to also receive an auxiliary signal and/or an audio Bluetooth signal and any one or combination of any of the signals received by the first mixer 72 may be output to the first speaker 50 according to design considerations.

In other embodiments a shown in FIG. 3 and described above, the equalized hearing aid 200 may include a microphone 11 connected directly to the Bluetooth module 80. This microphone 11 can be used to send inputted sound to the Bluetooth device 95 as well as to the mixer 70 when desired. In another embodiment also similar to that describing FIG. 3 above, the equalized hearing aid 200 may include the microphone 11 connected directly to the Bluetooth module 80 but the connection line 201, connecting the microphone 10 and the Bluetooth module 80, may not be present.

Figure 11:
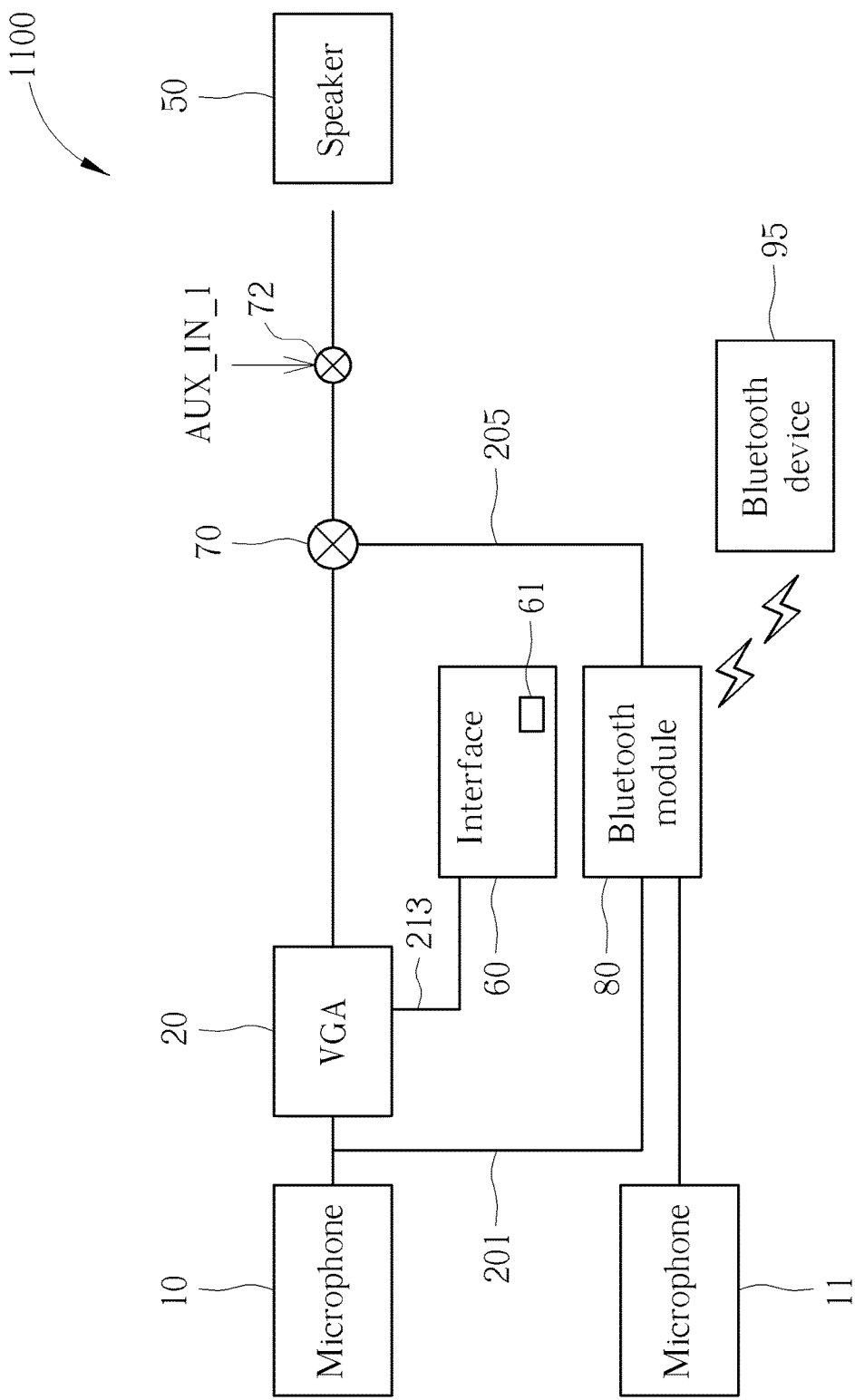
FIG. 11 is a functional block diagram of a hearing aid having preferred enhancements to the hearing aid of FIG. 3.

Because it may be difficult for some users to fully benefit from use of the equalizer 30, some embodiments of the hearing aid 1100 as shown in FIG. 11 may not comprise the equalizer 30. In FIG. 11, because the equalizer 30 is not present, VGA 20 may be connected to the interface 60 via connection line 213, and the VGA 20 also may be connected directly to the second mixer 70. As before, inclusion or exclusion of the microphone 11 and/or connecting line 201 are intended to be considered additional embodiments of the hearing aid 1100.

Figure 4:
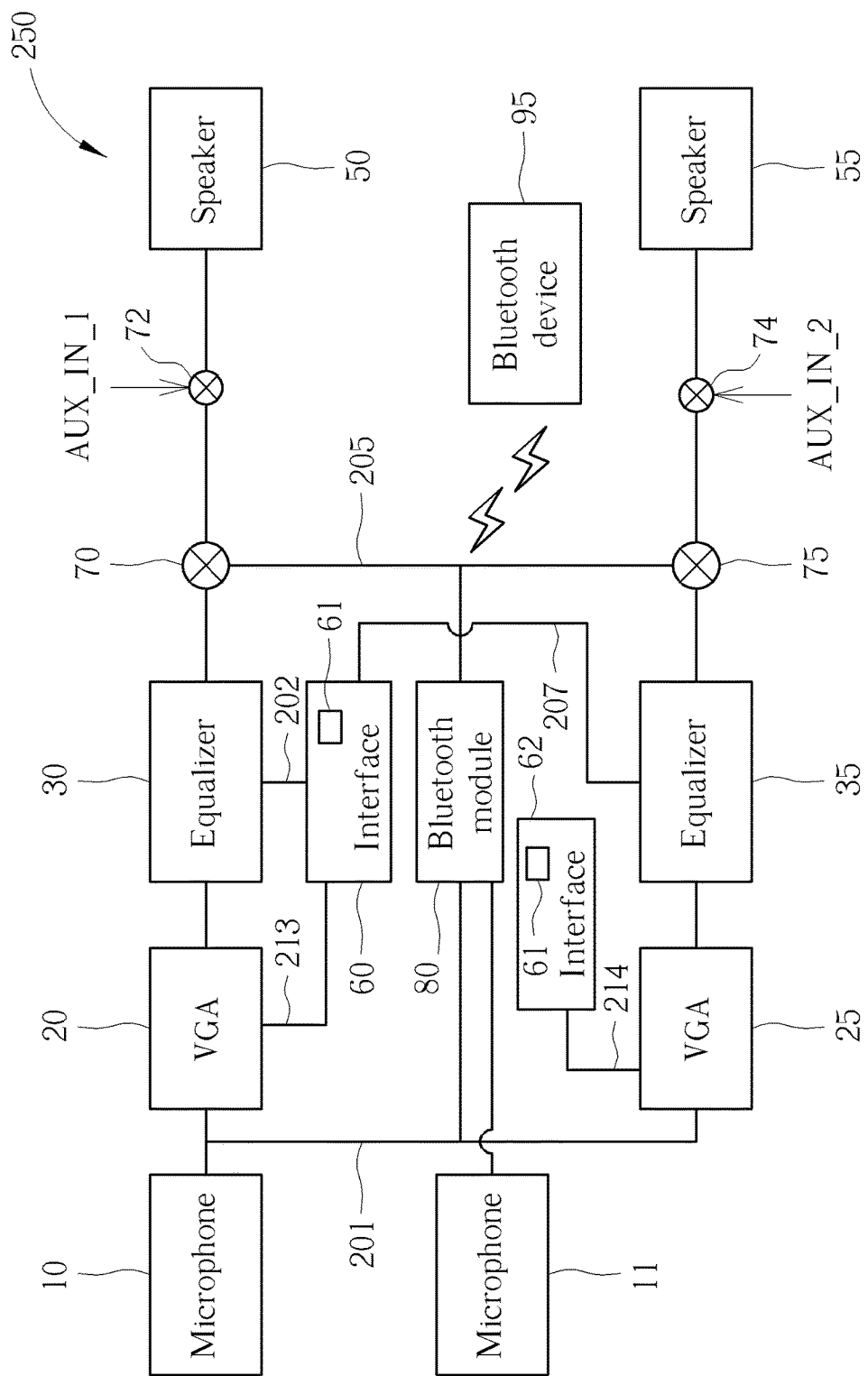
FIG. 4 is a functional block diagram of an equalized hearing aid having preferred enhancements to the equalized hearing aid of FIG. 2.

FIG. 4 is a functional block diagram of an equalized hearing aid 250 having preferred enhancements to the equalized hearing aids 150 and 200. The equalized hearing aid 250 may include the microphone 10, the first VGA 20, the first equalizer 30, the second mixer 70, the first mixer 72, the first speaker 50, the interface 60, the second VGA 25, the second equalizer 35, the third mixer 74, the fourth mixer 75, and the second speaker 55 coupled as shown in FIG. 4. The Bluetooth module 80 is coupled to the microphone 10 via connection line 201 so that audio signals from the microphone 10 can be transmitted to the Bluetooth enabled device 95 when desired. The equalized hearing aid 250 preferably also includes a connection line 205 coupling the mixers 70 and 75 to each other and to the Bluetooth module 80. The Bluetooth module 80 is further configured to transmit control signals received from another Bluetooth enabled device 95 to at least one of the first equalizer 30 for controlling the first equalizer 30 and the second equalizer 35 for controlling the second equalizer 35.

In other embodiments similar to that shown in FIG. 4 and described above, the equalized hearing aid 250 may include a microphone 11 connected directly to the Bluetooth module 80. In another embodiment also similar to that described above, the equalized hearing aid 250 may include the microphone 11 connected directly to the Bluetooth module 80, but the portion of connection line 201, connecting the microphone 10 and the Bluetooth module 80, may not be present.

Figure 12:
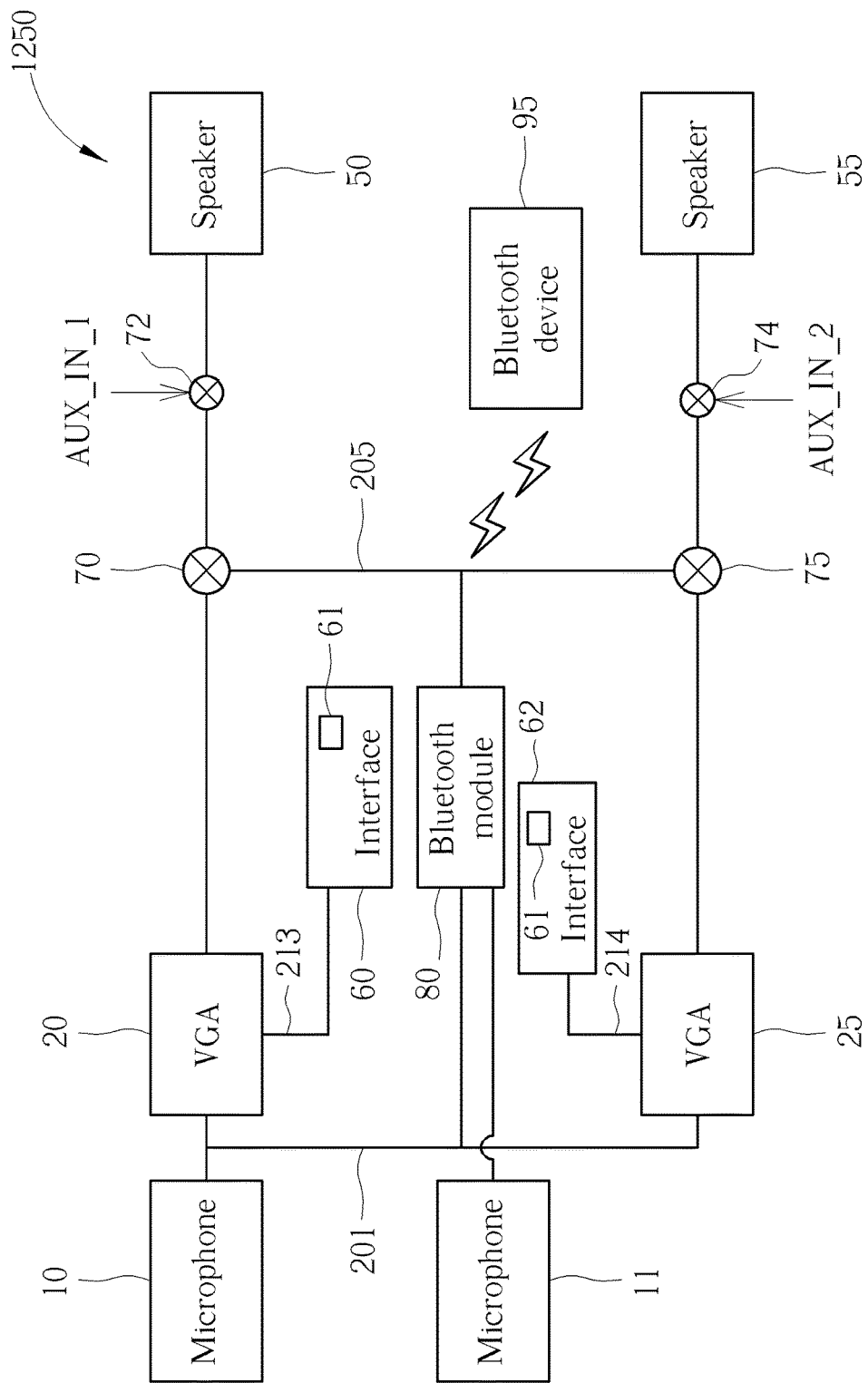
FIG. 12 is a functional block diagram of a hearing aid having preferred enhancements to the hearing aid of FIG. 4.

Some embodiments similar to that shown in FIG. 4 are shown in FIG. 12 and may not comprise the equalizers 30 and 35. In FIG. 12, because the equalizers 30 and 35 are not present, VGA 20 may be connected to the interface 60 via connection line 213 and also may be connected directly to the second mixer 70. VGA 25 may be connected to the interface 62 via connection line 214 and also may be directly connected to the fourth mixer 75. As before, inclusion or exclusion of the microphone 11 are intended to be considered additional embodiments of the hearing aid 1250.

Figure 5:
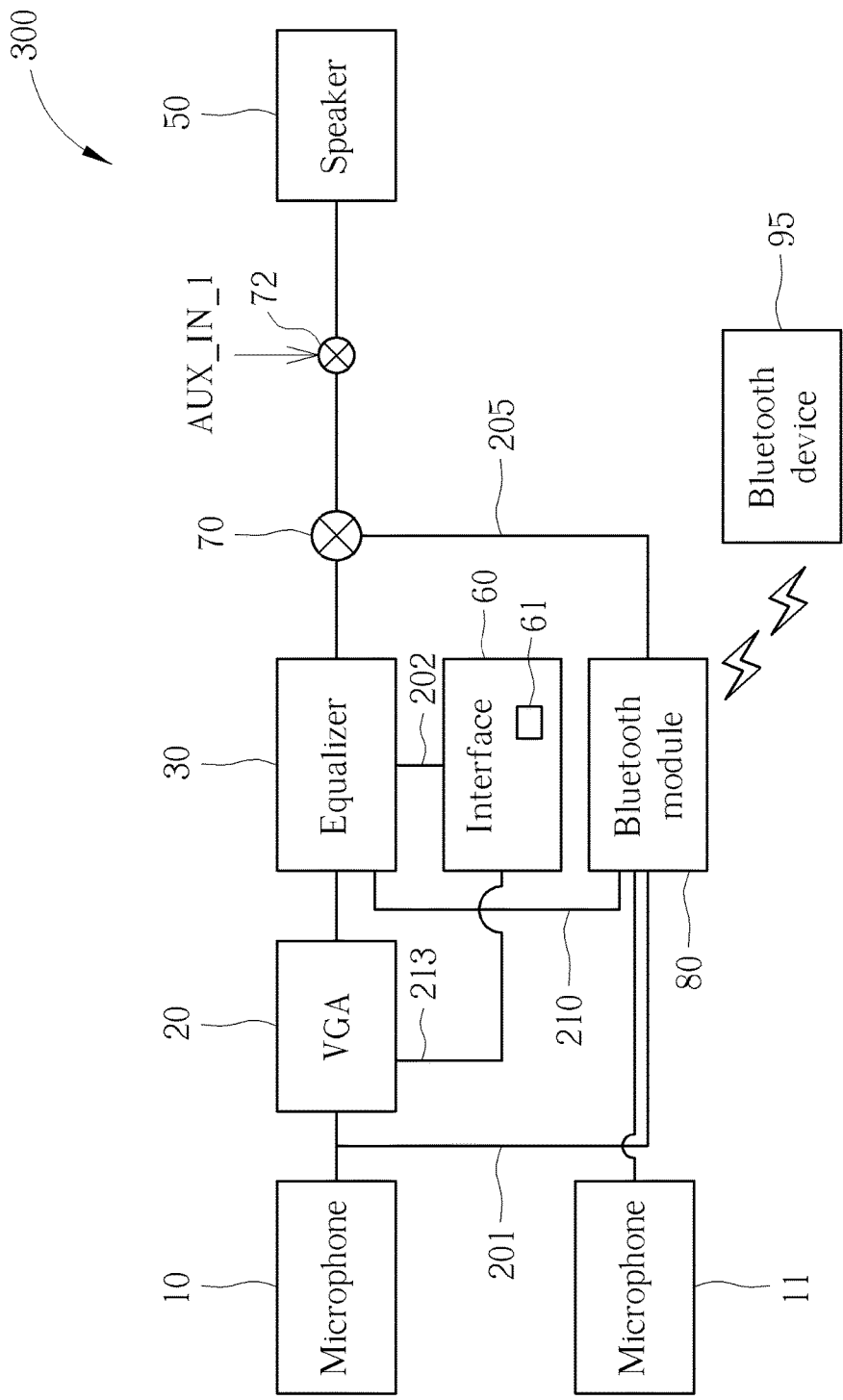
FIG. 5 is a functional block diagram of an equalized hearing aid having preferred enhancements to the equalized hearing aid of FIG. 3.

FIG. 5 is a functional block diagram of an equalized hearing aid 300 having preferred enhancements to the equalized hearing aids 100, 150, 200, and 250.

The equalized hearing aid 300 may include the microphone 10, the first VGA 20, the first equalizer 30, the second mixer 70, the first mixer 72, and the first speaker 50 coupled in series, and also preferably includes the control interface 60, and the Bluetooth module 80 along with connection line 201 between the Bluetooth module 80 and the output of the microphone 10, connection line 210 between the Bluetooth module 80 and the first equalizer 30, and connection line 205 between the Bluetooth module 80 and the second mixer 70.

Thus, when the Bluetooth module 80 is paired with the suitable Bluetooth enabled device 95, audio signals transmitted by the Bluetooth enabled device 95 are received by the Bluetooth module 80, transmitted from the Bluetooth module 80 to the second mixer 70, and combined by the second mixer 70 with equalized audio signals originating at the microphone 10 to produce a combined audio signal transmitted to the first mixer 72. It is again noted that the first mixer 72 is configured to also receive an auxiliary signal and/or an audio Bluetooth signal and any one or combination of any of the signals received by the first mixer 72 may be output to the first speaker 50 according to design considerations. The Bluetooth module 80 is further configured to transmit control signals received from another Bluetooth enabled device 95 to the first equalizer 30 for controlling the first equalizer 30 via connection line 210.

In other embodiments similar to that shown in FIG. 5 and described above, the equalized hearing aid 300 may include a microphone 11 connected directly to the Bluetooth module 80. In another embodiment also similar to that described above, the equalized hearing aid 300 may include the microphone 11 connected directly to the Bluetooth module 80, but the connection line 201, previously connecting the microphone 10 and the Bluetooth module 80, may not be present.

Some embodiments similar to that shown in FIG. 5 may not comprise the equalizer 30. If the equalizer 30 is not present, VGA 20 may be connected to the interface 60 via connection line 213 and VGA 20 may be connected directly to the second mixer 70. As before, inclusion or exclusion of the microphone 11 and/or connecting line 201 are intended to be considered additional embodiments of the hearing aid 300.

Figure 6:
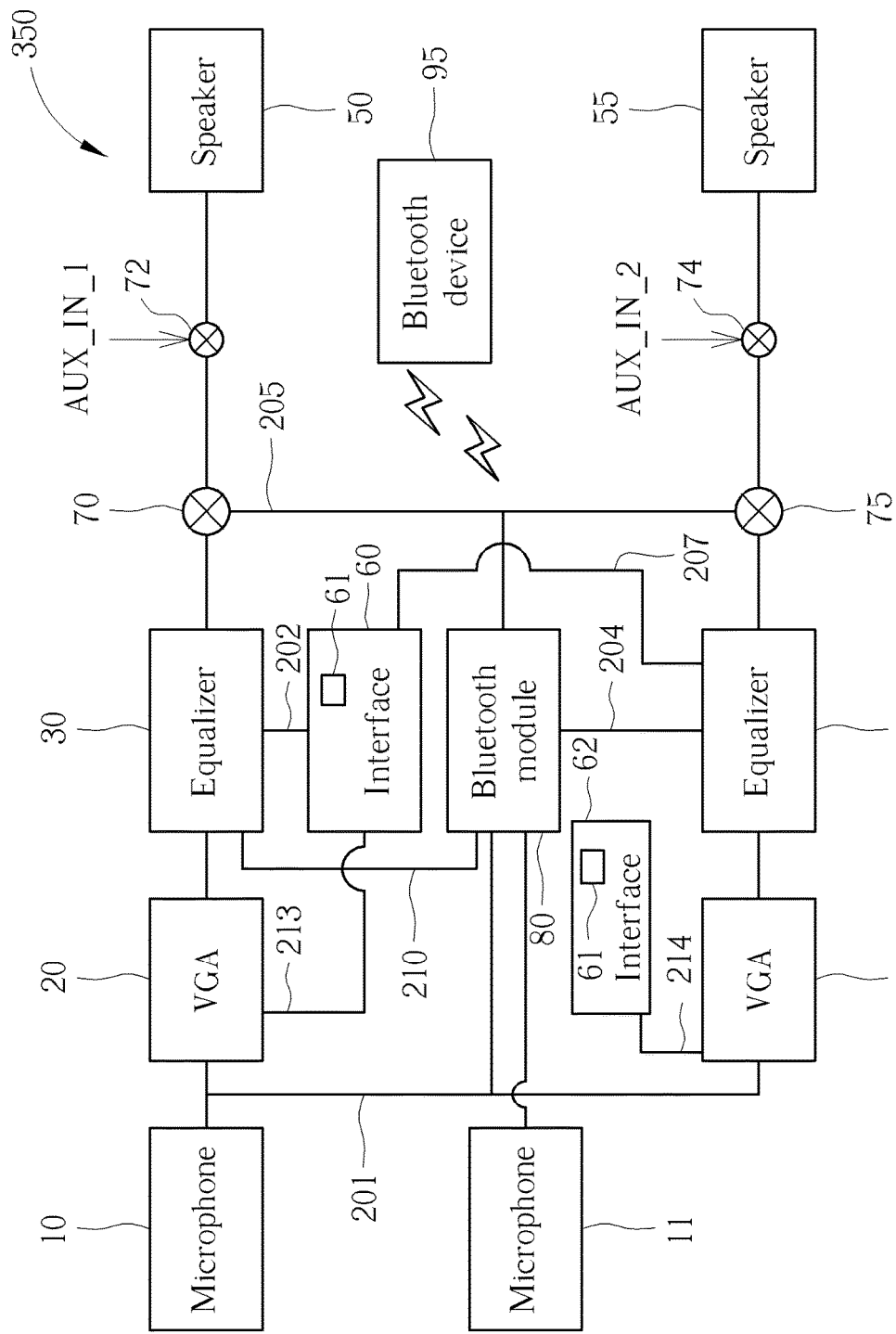
FIG. 6 is a functional block diagram of an equalized hearing aid having preferred enhancements to the equalized hearing aid of FIG. 4.

FIG. 6 is a functional block diagram of an equalized hearing aid 350 having preferred enhancements to the equalized hearing aids 100, 150, 200, 250, and/or 300. The equalized hearing aid 350 may include the microphone 10, the first VGA 20, the first equalizer 30, the second mixer 70, the first mixer 72, and the first speaker 50 coupled in series. The equalized hearing aid 350 also preferably comprises the microphone 10, the second VGA 25, the second equalizer 35, the fourth mixer 75, the third mixer 74, and the second speaker 55 coupled in series, and the control interface 60 and the Bluetooth module 80.

Also preferably included are the connection line 201 coupling the output of the microphone 10 with the Bluetooth module 80 and the second VGA 25, connection line 210 coupling the Bluetooth module 80 with the first equalizer 30, connection line 204 coupling the Bluetooth module 80 with the second equalizer 35, connection line 202 coupling the interface 60 with the first equalizer 30, connection line 207 coupling the interface 60 with the second equalizer 35, and connection line 205 coupling the second mixer 70 with the fourth mixer 75. Because adjustment of the equalization levels of the audio signals received by the equalizers 30 and 35 can be made using the Bluetooth enabled device 95, the control interface 60 may or may not be included in the equalized hearing aid 350 according to design considerations.

In other embodiments similar to that shown in FIG. 6 and described above, the equalized hearing aid 350 may include a microphone 11 connected directly to the Bluetooth module 80. In another embodiment also similar to that described above, the equalized hearing aid 350 may include the microphone 11 connected directly to the Bluetooth module 80, but the connection line 201, previously connecting the microphone 10 and the Bluetooth module 80, may not be present.

Some embodiments similar to that shown in FIG. 6 may not comprise the equalizers 30 and 35. If the equalizers 30 and 35 are not present, VGA 20 may be connected to the interface 60 via connection line 213 and also may be connected directly to the second mixer 70. VGA 25 may be connected to the interface 62 via connection line 214 and also may be directly connected to the fourth mixer 75. As before, inclusion or exclusion of the microphone 11 and/or portions of connecting line 201 are intended to be considered additional embodiments of the hearing aid 350.

Figure 7:
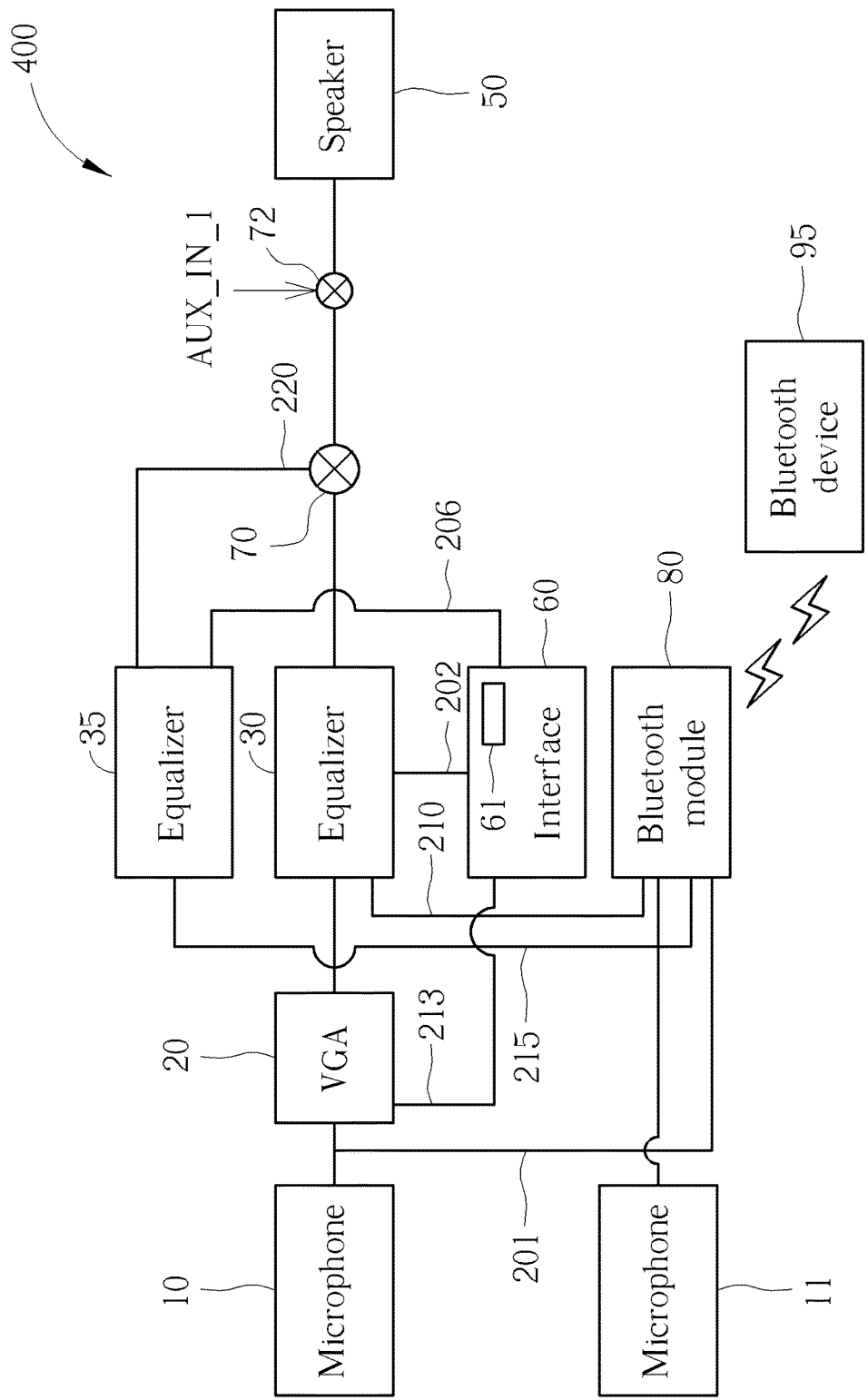
FIG. 7 is a functional block diagram of an equalized hearing aid having preferred enhancements to the equalized hearing aid of FIG. 5.

FIG. 7 is a function block diagram of an equalized hearing aid 400 that illustrates variations of the equalized hearing aids 100, 150, 200, 250, 300, and 350. The equalized hearing aid 400 may include the microphone 10, the first VGA 20, the first equalizer 30, the second mixer 70, the first mixer 72, and the first speaker 50 coupled in series, and also may comprise the control interface 60, the Bluetooth module 80, and the second equalizer 35. Also preferably included are the connection line 201 coupling the output of the microphone 10 with the Bluetooth module 80, connection line 210 coupling the Bluetooth module 80 with the first equalizer 30, connection line 215 coupling the Bluetooth module 80 with the second equalizer 35, connection line 202 coupling the interface 60 with the first equalizer 30, connection line 206 coupling the interface 60 with the second equalizer 35, and connection line 220 coupling the second equalizer 35 to the second mixer 70.

The equalized hearing aid 400 offers the ability to use the interface 60 to adjust parameters controlling the equalizers 30, 35, while parameters controlling the equalizers 30, 35 can also be set using the Bluetooth enabled device 95 via the Bluetooth module 80. Because the different audio signal sources (microphone 10 and Bluetooth enabled device 95) may have different audio characteristics, this enables a user to easily adjust the mixed audio signal exiting the second mixer 70 according to the user's desire.

In other embodiments similar to that shown in FIG. 7 and described above, the equalized hearing aid 400 may include a microphone 11 connected directly to the Bluetooth module 80. In another embodiment also similar to that described above, the equalized hearing aid 400 may include the microphone 11 connected directly to the Bluetooth module 80, but the connection line 201, previously connecting the microphone 10 and the Bluetooth module 80, may not be present.

Some embodiments similar to that shown in FIG. 7 may not comprise the equalizers 30 and 35. If the equalizers 30 and 35 are not present, VGA 20 may be connected to the interface 60 via connection line 213 and also may be connected directly to the second mixer 70. As before, inclusion or exclusion of the microphone 11 and/or connecting line 201 are intended to be considered additional embodiments of the hearing aid 400.

Figure 8:
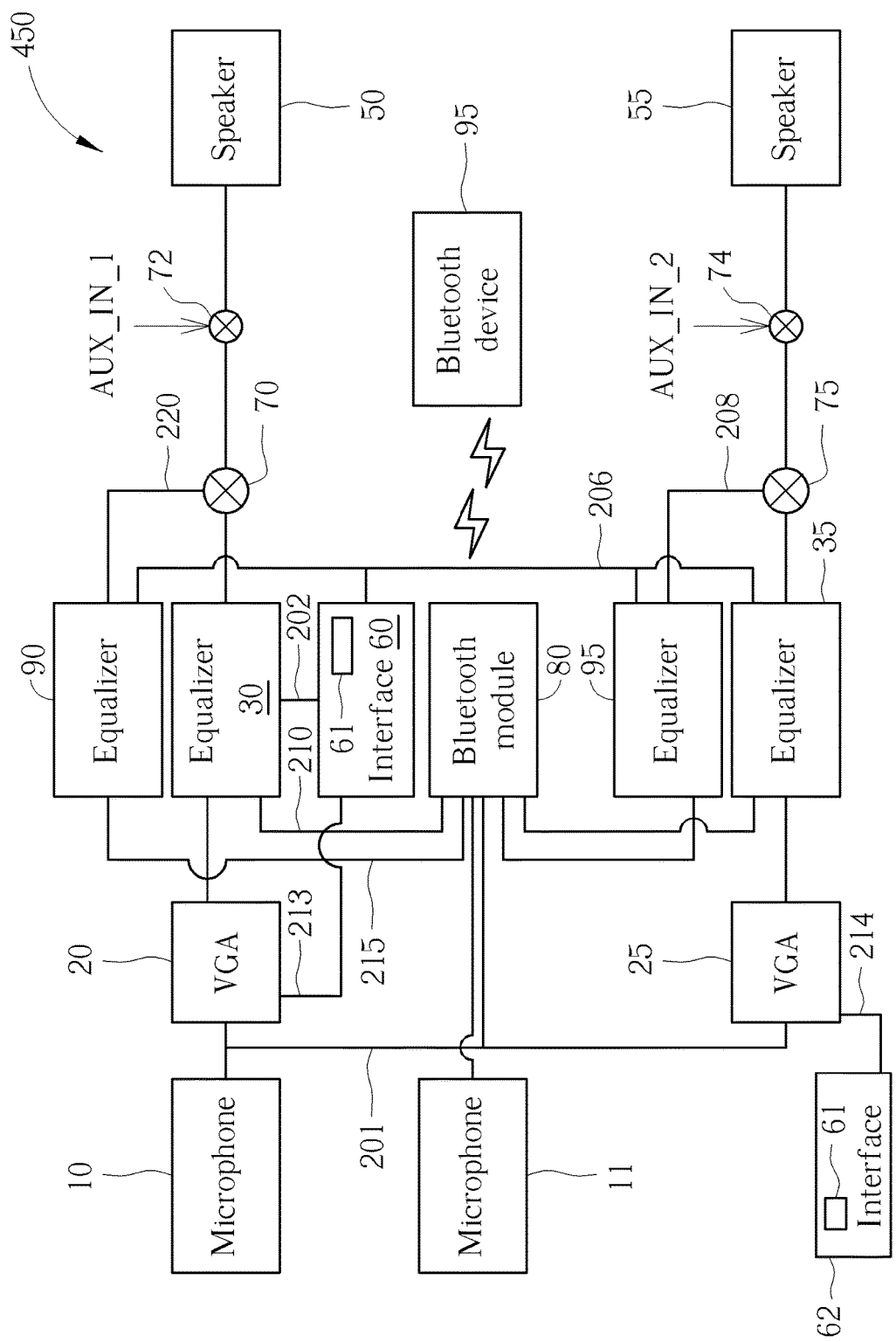
FIG. 8 is a functional block diagram of an equalized hearing aid having preferred enhancements to the equalized hearing aid of FIG. 6.

FIG. 8 is a functional block diagram of an equalized hearing aid 450 having preferred enhancements to the equalized hearing aids 100, 150, 200, 250, 300, 350, and/or 400. The equalized hearing aid 450 may include the microphone 10, the first VGA 20, the first equalizer 30, the second mixer 70, the first mixer 72, and the first speaker 50 coupled in series to form the first signal path. The equalized hearing aid 450 also preferably comprises the microphone 10, the second VGA 25, the second equalizer 35, the fourth mixer 75, the third mixer 74, and the second speaker 55 coupled in series forming the second signal path, and the control interface 60 and the Bluetooth module 80. New enhancements preferably included in the equalized hearing aid 450 include a third equalizer 90 and a fourth equalizer 95.

Also preferably included are the connection line 201 coupling the output of the microphone 10 with the Bluetooth module 80 and the second VGA 25, connection line 215 coupling the Bluetooth module 80 with the third equalizer 90 and coupling the Bluetooth module 80 with the fourth equalizer 95, connection line 210 coupling the Bluetooth module 80 with the first equalizer 30 and coupling the Bluetooth module 80 with the second equalizer 35, connection line 202 coupling the interface 60 with the first equalizer 30, connection line 206 coupling the interface 60 with the second equalizer 35, the third equalizer 90, and the fourth equalizer 95, connection line 208 coupling the fourth equalizer 95 with the fourth mixer 75, and connection line 220 coupling the third equalizer 90 with the second mixer 70.

The structure of the equalized hearing aid 450 permits a user of the Bluetooth enabled device 95 to set control parameters of at least one of the first equalizer 30, the second equalizer 35, the third equalizer 90, and the fourth equalizer 95, respectively. The interface 60 also permits a user to set control parameters of at least one of the first equalizer 30, the second equalizer 35, the third equalizer 90, and the fourth equalizer 95, respectively. The parameters for each of the four equalizers 30, 35, 90, 95 may be the same or may differ according to user considerations. This arrangement allows the user to determine a desired and possibly separate balance between audio sources (microphone 10, Bluetooth enabled device 95, auxiliary input AUX_IN_1, AUX_IN_2) for each of the two channels respectively output by the two speakers 50 and 55.

A particular advantage of the equalized hearing aids 150, 250, 350, and 450 is the ability to individually control audio characteristics for each of the left and right channels; something that is appreciated by a user where capabilities of one ear may differ from capabilities of the user's other ear.

In other embodiments similar to that shown in FIG. 8 and described above, the equalized hearing aid 450 may include a microphone 11 connected directly to the Bluetooth module 80. In another embodiment also similar to that described above, the equalized hearing aid 450 may include the microphone 11 connected directly to the Bluetooth module 80, but the portion of the connection line 201, previously connecting the microphone 10 and the Bluetooth module 80, may not be present.

Some embodiments similar to that shown in FIG. 8 may not comprise the equalizers 30, 35, 90, and 95. If the equalizers 30, 35, 90, and 95 are not present, VGA 20 may be connected to the interface 60 via connection line 213 and also directly connected to the second mixer 70. VGA 25 may be connected to the interface 62 via connection line 214 and also may also be directly connected to the fourth mixer 75. As before, inclusion or exclusion of the microphone 11 and/or portions of connecting line 201 are intended to be considered additional embodiments of the hearing aid 450.

Figure 9:
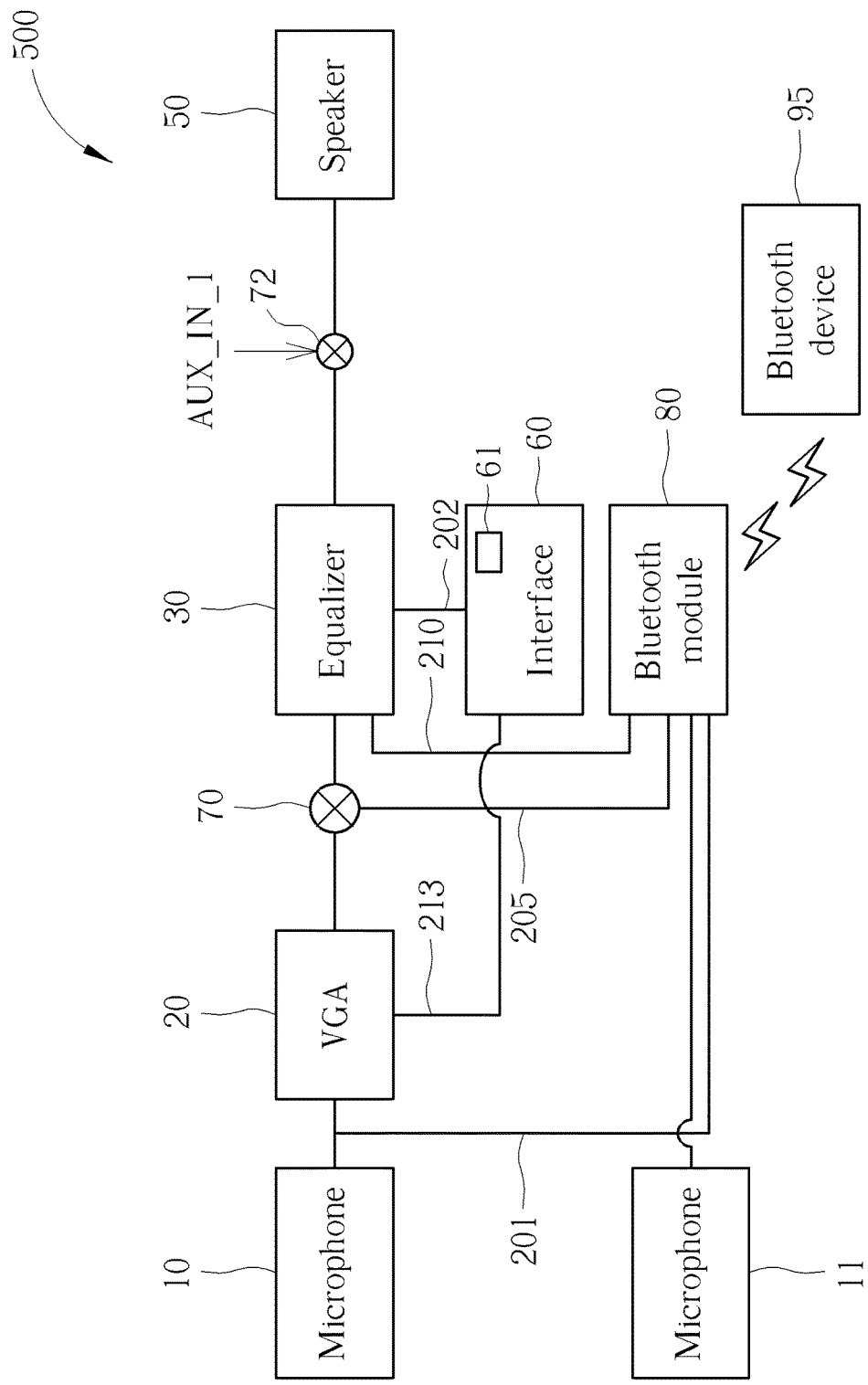
FIG. 9 is a functional block diagram of an equalized hearing aid that illustrates variations of the equalized hearing aids shown in FIG. 1, FIG. 3, FIG. 5, and FIG. 7.

FIG. 9 is a functional block diagram of an equalized hearing aid 500 that is a possible variation of the equalized hearing aids 200, 300, and/or 400. A difference in the equalized hearing aid 500 is that the second mixer 70 is serially coupled between the microphone 10 and the first equalizer 30 instead of between the first equalizer 30 and the first mixer 72 according to design considerations.

Placement of the second mixer 70 between the microphone 10 and the first equalizer 30 allows audio signals transmitted from the Bluetooth module 80 to be mixed with audio signals originating from the microphone 10 before being transmitted to the first equalizer 30.

In other embodiments similar to that shown in FIG. 9 and described above, the equalized hearing aid 500 may include a microphone 11 connected directly to the Bluetooth module 80. In another embodiment also similar to that described above, the equalized hearing aid 500 may include the microphone 11 connected directly to the Bluetooth module 80, but the connection line 201, previously connecting the microphone 10 and the Bluetooth module 80, may not be present.

Some embodiments similar to that shown in FIG. 9 may not comprise the equalizer 30. If the equalizer 30 is not present, VGA 20 may be connected to the interface 60 via connection line 213 and directly connected to the second mixer 70. As before, inclusion or exclusion of the microphone 11 and/or connecting line 201 are intended to be considered additional embodiments of the hearing aid 500.

Figure 10:
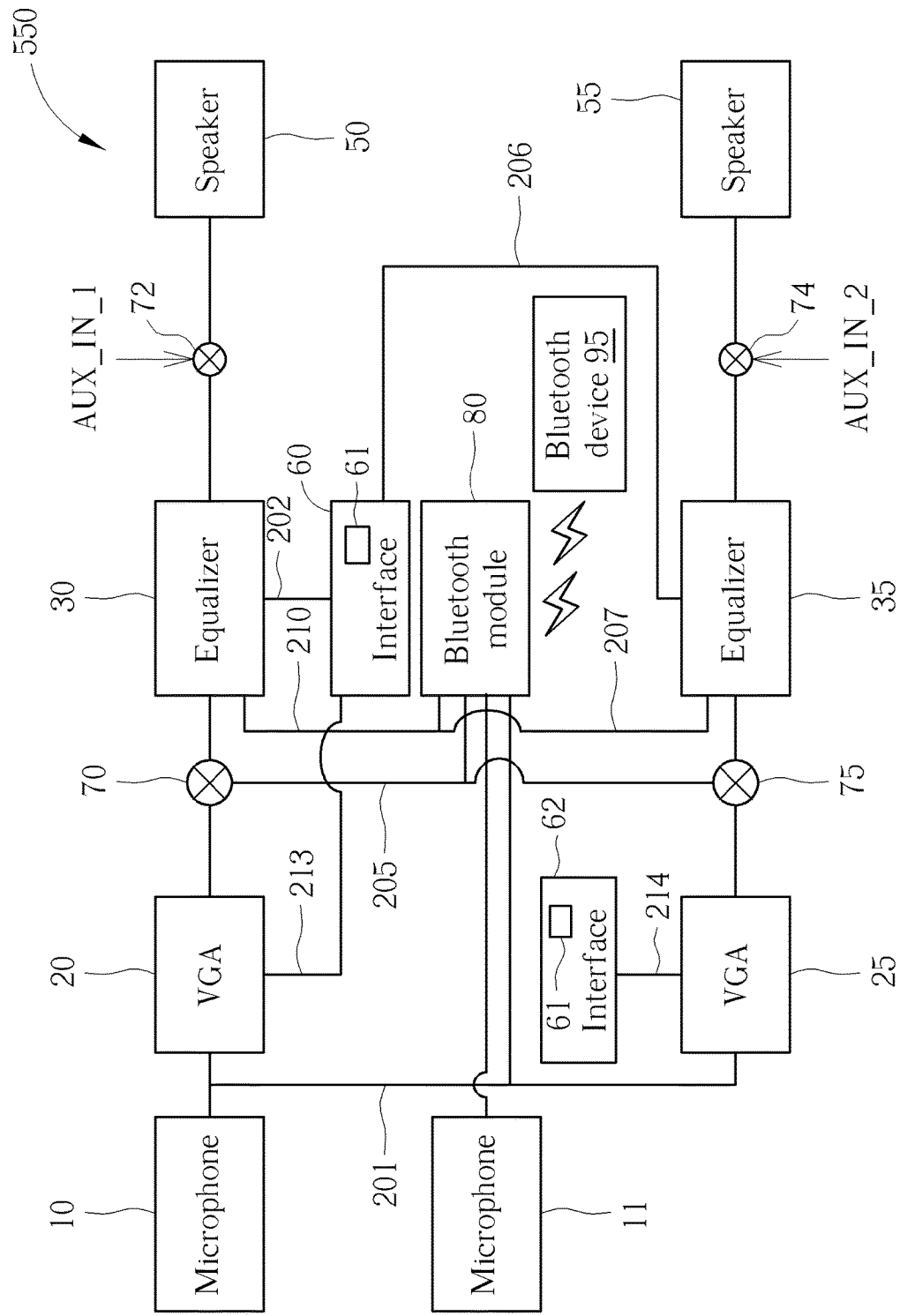
FIG. 10 is a functional block diagram of an equalized hearing aid that illustrates variations of the equalized hearing aids shown in FIG. 2, FIG. 4, FIG. 6, and FIG. 8.

FIG. 10 is a functional block diagram of an equalized hearing aid 550 that is a possible variation of the equalized hearing aids 150, 250, and/or 350. A difference in the equalized hearing aid 550 is that the second mixer 70 is serially coupled between the microphone 10 and the first equalizer 30 and the fourth mixer 75 is serially coupled between the microphone 10 and the second equalizer 35, again according to design considerations.

Placement of the mixers 70 and 75 between the microphone 10 and the first equalizer 30 and the second equalizer 35 respectively allows audio signals originating from the microphone 10 to be mixed with audio signals transmitted from the Bluetooth module 80 before entering the first equalizer 30 and/or the second equalizer 35. This arrangement provides the ability to individually control audio characteristics for each of the left and right channels when desired.

In other embodiments similar to that shown in FIG. 10 and described above, the equalized hearing aid 550 may include a microphone 11 connected directly to the Bluetooth module 80. In another embodiment also similar to that described above, the equalized hearing aid 550 may include the microphone 11 connected directly to the Bluetooth module 80, but the portion of connection line 201, previously connecting the microphone 10 and the Bluetooth module 80, may not be present.

Figure 13:
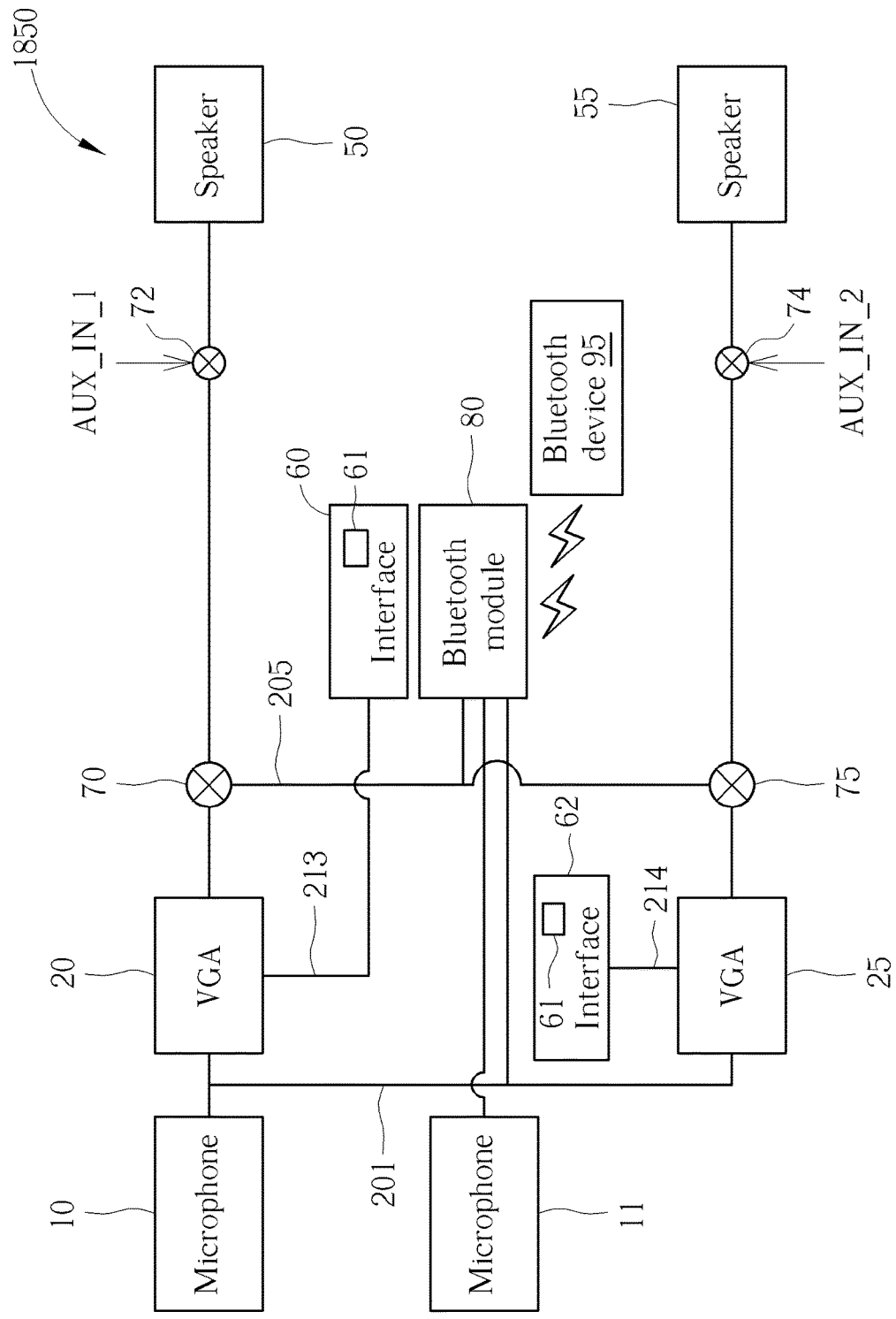
FIG. 13 is a functional block diagram of a hearing aid that illustrates variations of the hearing aids shown in FIG. 2, FIG. 4, FIG. 6, and FIG. 8.

Some embodiments similar to that shown in FIG. 10 may not comprise the equalizers 30 and 35. In FIG. 13, because the equalizers 30 and 35 are not present, VGA 20 may be connected to the interface 60 via connection line 213 and also directly connected to the second mixer 70. VGA 25 may be connected to the interface 62 via connection line 214 and also directly connected to the second mixer 74. As before, inclusion or exclusion of the microphone 11 and/or portions of connecting line 201 are intended to be considered additional embodiments of the hearing aid 1850.

An equalized hearing aid is proposed that includes an equalizer that is adjustable via a control interface 60 and/or a Bluetooth enabled device 95 depending upon local environmental variables or user preferences in different situations. The included Bluetooth module 80 additionally permits sound acquired by the microphone 10 to be transmitted to the Bluetooth enabled device 95 and/or sound or audio signals originating from the Bluetooth enabled device and/or an auxiliary input to reproduce sound with the speaker 50, or generate individual left and right audio channels to possibly reproduce stereo sound with the speakers 50 and 55. The disclosed equalized hearing aids permit the user great flexibility to control amplitudes of differing audio frequency bands whether from a single source or simultaneously from multiple sources and is easily user adjustable depending upon local environmental variables or user preferences in different situations through the use of the control interface 60 or the Bluetooth enabled device 95.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A hearing aid system comprising:
   a microphone, a first variable gain amplifier, a first mixer, and a first speaker coupled in series forming a first signal path;
   a Bluetooth module configured to receive signals from another Bluetooth enabled device or to transmit signals to the another Bluetooth enabled device;
   another microphone coupled to the Bluetooth module for transmitting signals received from the another microphone to the another Bluetooth enabled device; and
   a second mixer coupled in series between the first variable gain amplifier and the first mixer, wherein the Bluetooth module is coupled to the second mixer to transmit audio signals received from the another Bluetooth enabled device to the second mixer;
   wherein the first mixer is configured to optionally receive a first signal from the first variable gain amplifier or a second signal from a first auxiliary input for output to the first speaker, or combine the first and second signals to output the combined signal to the first speaker.

2. The hearing aid system of claim 1 further comprising a control interface coupled to the first variable gain amplifier for controlling the first variable gain amplifier.

3. The hearing aid system of claim 1 wherein the Bluetooth module is further coupled to an output of the microphone and is configured to transmit audio signals received from the microphone to the another Bluetooth enabled device.

4. A hearing aid system comprising:
   a microphone, a first variable gain amplifier, a first mixer, and a first speaker coupled in series forming a first signal path, wherein the first mixer is configured to optionally receive signal from the first variable gain amplifier or signal from a first auxiliary input for output to the first speaker, or combine the received signals to output the combined signal to the first speaker;
   a Bluetooth module configured to receive signals from another Bluetooth enabled device or to transmit signals to the another Bluetooth enabled device, the Bluetooth module coupled to the first variable gain amplifier and is further configured to transmit control signals received from the another Bluetooth enabled device to the first variable gain amplifier for controlling the first variable gain amplifier; and
   a second mixer coupled in series between the first variable gain amplifier and the first mixer, wherein the Bluetooth module is coupled to the second mixer to transmit audio signals received from the another Bluetooth enabled device to the second mixer.

5. The hearing aid system of claim 4 further comprising another microphone coupled to the Bluetooth module for transmitting signals received from the another microphone to the another Bluetooth enabled device.

6. A hearing aid system comprising:
   a microphone, a first variable gain amplifier, a first mixer, and a first speaker coupled in series forming a first signal path, wherein the first mixer is configured to optionally receive signal from the first variable gain amplifier or signal from a first auxiliary input for output to the first speaker, or combine the received signals to output the combined signal to the first speaker;
   the microphone, a second variable gain amplifier, a second mixer, and a second speaker coupled in series forming a second signal path; and
   a Bluetooth module configured to transmit control signals received from another Bluetooth enabled device to at least one of the first variable gain amplifier for controlling the first variable gain amplifier and the second variable gain amplifier for controlling the second variable gain amplifier;
   wherein the second mixer is configured to optionally receive signal from the second variable gain amplifier or signal from a second auxiliary input for output to the second speaker, or combine the received signals to output the combined signal to the second speaker.

7. The hearing aid system of claim 6 further comprising a control interface coupled to the second variable gain amplifier for controlling the second variable gain amplifier.

8. The hearing aid system of claim 6 further comprising a third mixer coupled between the first variable gain amplifier and the first mixer, a fourth mixer coupled between the second variable gain amplifier and the second mixer, wherein an output of the Bluetooth module is coupled to the third mixer and to the fourth mixer.

9. The hearing aid system of claim 8, wherein the Bluetooth module is coupled to the first variable gain amplifier and to the second variable gain amplifier, and the Bluetooth module is configured to transmit control signals received from the another Bluetooth enabled device to at least one of the first variable gain amplifier and the second variable gain amplifier.

10. The hearing aid system of claim 9, wherein an output of the first variable gain amplifier and is coupled to an output of the second variable gain amplifier.

11. The hearing aid system of claim 6, further comprising an equalizer coupled in the first signal path.

* * * * *